United States Patent
Koide et al.

(10) Patent No.: US 6,188,087 B1
(45) Date of Patent: *Feb. 13, 2001

(54) SEMICONDUCTOR LIGHT-EMITTING DEVICE

(75) Inventors: Norikatsu Koide, Nagoya; Masayoshi Koike, Ichinomiya; Shiro Yamasaki, Inazawa; Isamu Akasaki; Hiroshi Amano, both of Nagoya, all of (JP)

(73) Assignees: Toyoda Gosei Co., Ltd, Nishikasugai-gun (JP); Isamu Akasaki, Nagoya (JP); Hiroshi Amano, Nagoya (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/925,323

(22) Filed: Sep. 8, 1997

(30) Foreign Application Priority Data

Sep. 8, 1996 (JP) .................................................. 8-257818

(51) Int. Cl.⁷ ........................ H01L 33/00; H01L 31/0304
(52) U.S. Cl. ................................ 257/103; 257/97; 257/96
(58) Field of Search ................................ 257/82, 98, 97, 257/96, 103

(56) References Cited

U.S. PATENT DOCUMENTS

| | | | | |
|---|---|---|---|---|
| 5,466,950 | * | 11/1995 | Sugawara et al. | 257/98 |
| 5,502,316 | * | 3/1996 | Kish et al. | 257/98 |
| 5,592,501 | * | 1/1997 | Edmond et al. | 372/45 |
| 5,641,582 | * | 6/1997 | Nire et al. | 257/98 |
| 5,656,823 | * | 8/1997 | Kruangam | 257/98 |
| 5,760,945 | * | 6/1998 | Coleman | 359/271 |
| 5,877,558 | * | 3/1999 | Nakamura et al. | 257/749 |
| 5,929,466 | * | 7/1999 | Ohba . | |

OTHER PUBLICATIONS

"P–GaN/N—InGaN/N—GaN Double—Heterostructure Blue–Light–Emitting Diodes," Jpn. J. Appl. Phys., Nakamura et al., vol. 32, pp. L8–L11, 1993.

Shuji Nakamura; Growth of $In_xGa_{(1-x)}N$ Compound Semiconductors and High–Power InGaN/AlGaN Double Heterostructure Violet–Light–Emitting Diodes; Microelectronics Journal, vol. 25; (1994), pp. 651–659.

Kozo Osamura, et al.; Preparation and Optical Properties of $Ga_{1-x}In_xN$ Thin Films; Journal of Applied Physics; vol. 46, No. 8; Aug. 1975; pp. 3432–3437.

* cited by examiner

*Primary Examiner*—Jerome Jackson, Jr.
(74) *Attorney, Agent, or Firm*—Pillsbury Madison & Sutro, LLP

(57) ABSTRACT

A novel light-emitting device includes a sapphire substrate with a light-emitting layer comprising $In_xGa_{1-x}N$, where the critical value of the indium mole fraction X is determined by a newly derived relationship between the indium mole fraction X and the wavelength $\lambda$ of emitted light.

28 Claims, 2 Drawing Sheets

SEMICONDUCTOR LIGHT-EMITTING DEVICE

BACKGROUND OF THE INVENTION

1. Field of the Invention

This invention relates to a semiconductor light-emitting device. This semiconductor light-emitting device can be utilized as a light-emitting diode, a laser diode, or the like.

2. Description of the Conventional Art

Light-emitting devices using compound semiconductors cover visible short wavelength regions. Among other light-emitting diodes, nitride III semiconductors have attracted attention in recent years because these semiconductors are direct transition semiconductors, so that they exhibit high light-emitting efficiency, and because these semiconductors emit blue light, which is one of the three primary colors.

When the light-emitting layer is formed of $In_XGa_{1-X}N$, it has heretofore been considered that a relation such as shown by the dashed line in FIG. 1 exists between the indium mole fraction X and the photon energy (see "Journal of applied physics", Vol. 46, No. 8, August 1975, pp. 3432–3437 and "Microelectronics Journal", 25 (1994), pp. 651–659). The photon energy of the wavelength $\lambda$ of blue light (470 nm) is almost 2.64 eV, and the photon energy of the wavelength $\lambda$ of green light (520 nm) is almost 2.38 eV. Therefore, according to the conventionally proposed relation, blue emission is obtained by setting the indium mole fraction X to approximately 0.26 and green emission is obtained by setting the indium mole fraction X to approximately 0.67 if no impurities are to be added.

As a result of a continued study on the light-emitting layer formed of $In_XGa_{1-X}N$, the inventors realized that the conventionally proposed relationship shown by the dashed line in FIG. 1 could not be applied without modification if such a light-emitting layer is to be formed on a sapphire substrate.

SUMMARY OF THE INVENTION

To overcome the aforementioned problem, the inventors further studied the relationship between the indium mole fraction X and the photon energy in a light-emitting layer formed of $In_XGa_{1-X}N$ on a sapphire substrate. As a result, a relationship shown by the solid line in FIG. 1 was found. When converted into a relationship between a wavelength $\lambda$ and the indium mole fraction X, this relationship can be given as follows.

$$\lambda \ (nm) = 1239.8/Eg \ (eV) \quad (1)$$

$$Eg = 3.4*(1-X) + 1.95*X - 4.26*X*(1-X) \quad (2)$$

According to the above equations (1) and (2), a ray of light having a peak wavelength ranging from 460 to 480 nm is emitted when the indium mole fraction X is set to 0.14 to 0.16. As a result, when the indium mole fraction X in a light-emitting layer formed of $In_XGa_{1-X}N$ on a sapphire substrate was set to 0.13 to 0.18, it was found that blue light, i.e., blue light as visually observed by people, was emitted from such a light-emitting layer.

Further, according to the above equations (1) and (2), a ray of light having a peak wavelength ranging from 510 to 530 nm is emitted when the indium mole fraction X is set to 0.20 to 0.23. As a result, when the indium mole fraction X in a light-emitting layer formed of $In_XGa_{1-X}N$ on a sapphire substrate was set to 0.19 to 0.26, it was found that green light, i.e., green light as visually observed by people, was emitted from such light-emitting layer.

The solid line in FIG. 1 that shows the newly discovered relationship is characterized by a line more sharply inclined than the dashed line in FIG. 1, which shows the conventionally proposed relationship. A conceivable reason therefore is that since the lattice constant of a semiconductor constituting the light-emitting layer is different from that of the sapphire substrate, the light-emitting layer is distorted, and as a result, the photon energy is decreased, i.e., the wavelength is shifted toward long wavelengths even if the indium mole fractions are the same.

The relationships shown in FIG. 1 illustrate cases where light-emitting layers are formed of $In_XGa_{1-X}N$ with no intentional impurities contained.

Of course, impurities can be doped into a compound semiconductor constituting a light-emitting layer. When impurities are doped into a light-emitting layer, the wavelength is shifted toward long wavelengths even if the indium mole fraction is the same. On the other hand, if the light-emitting layer contains a quantum well layer, the wavelength is shifted toward short wavelengths due to quantum effects.

It may be noted that the data shown by the solid line in FIG. 1 were obtained as follows.

A 2 $\mu$m-thick GaN layer was formed on a surface a of a disc-like 100 $\mu$m-thick sapphire substrate by means of a metal organic vapor phase epitaxial growth method (hereinafter abbreviated as the "MOVPE method"), and a 20 nm-thick $In_XGa_{1-X}N$ layer was formed thereon similarly by means of the MOVPE method.

A pulse laser was irradiated (at an excitation strength of 200 kW/cm$^2$) onto the $In_XGa_{1-X}N$ layer at room temperature. Then, the wavelength $\lambda$ of a ray of light emitted from the $In_XGa_{1-X}N$ layer was measured. The photon energy Eg was calculated from the peak wavelength $\lambda$ of such ray of light. It may be noted that such a relationship as $\lambda$=1239.8/Eg is established between the wavelength $\lambda$ and the photon energy Eg (eV).

The indium mole fraction was calculated by means of an AES (Auger electron spectroscopy) method.

DETAILED DESCRIPTION OF THE PREFERRED EMBODIMENTS

The modes of embodiment of the invention will now be described further in detail with reference to specific examples.

1st Embodiment

Figure 2:
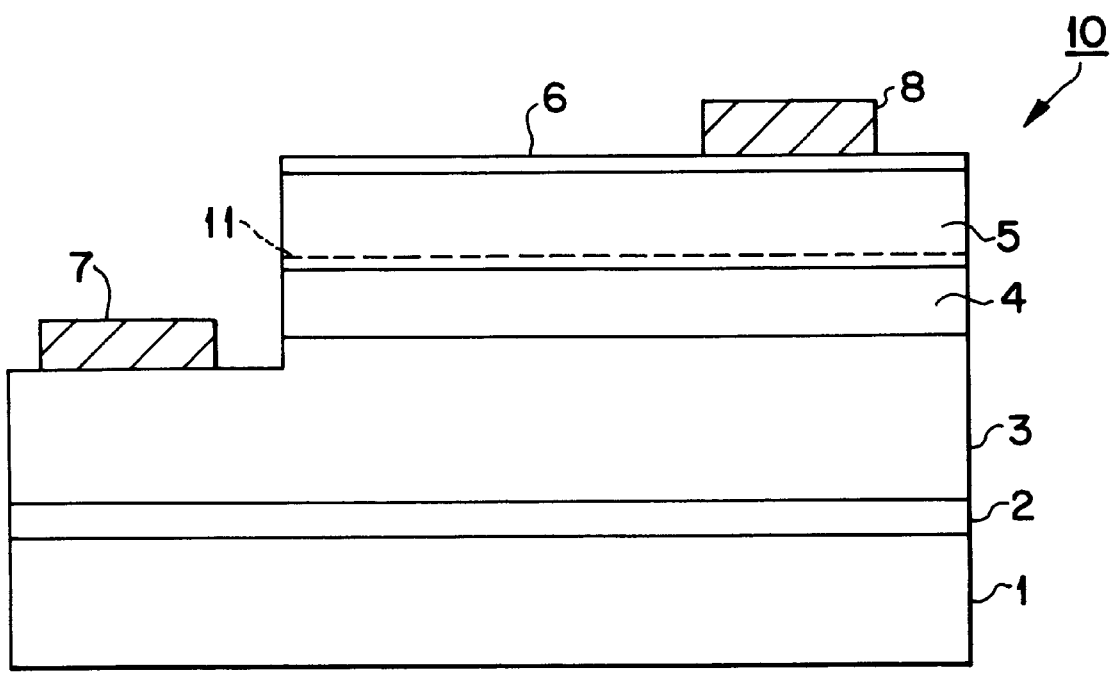
FIG. 2 is a sectional view of a light-emitting diode, which is an embodiment of the invention.

A semiconductor light-emitting device according to the first embodiment is a blue light-emitting diode having a peak wavelength of 470 nm. FIG. 2 is a sectional view of a light-emitting diode 10 according to this embodiment.

This light-emitting diode 10 is formed by having a buffer layer 2 comprising AlN, a first clad layer 3 comprising n-GaN, a light-emitting layer 4 made of InGaN, and a second clad layer 5 made of p-GaN doped with magnesium grown sequentially on a sapphire substrate 1. A transparent electrode 6 made of gold is further arranged on the upper surface of the second clad layer 5, and an electrode 8 is deposited further on the transparent electrode 6 by vacuum evaporation. An electrode pad 7 is arranged also on the first clad layer 3.

The first clad layer 3 is formed on the sapphire substrate 1 through the buffer layer 2 made of AlN. The first clad layer 3 may be of a double-layered structure with an n-layer having a low electron density on the light-emitting layer side and an n⁻ layer having a high electron density on the buffer layer side.

The light-emitting layer 4 is not limited to a double heterostructure shown in FIG. 2, but may be applied to a single heterostructure, a superlattice structure, and the like.

An $Al_XIn_YGa_{1-X-Y}N$ (including X=0, Y=0, X=Y=0) layer 11, which has a wide band gap and which is doped with an acceptor such as a group IIA element, preferably magnesium, may be interposed between the light-emitting layer 4 and the p-type second clad layer 5. This technique is employed for preventing electrons implanted into the light-emitting layer 4 from being diffused into the second clad layer 5.

The second layer 5 may be of a double structure with a p-layer having a low magnesium density on the light-emitting side and a p-layer having a high magnesium density on the electrode side.

The magnesium-doped p-type second clad layer 5 has a large resistance. Therefore, even if a current is introduced only from the electrode 8 to one end of the second clad layer 5, it is likely that current density will not become uniform over the entire area of the light-emitting layer 4. To overcome this problem, the thin-filmed transparent electrode 6 that extends over substantially the entire area of the second clad layer 5 is interposed between the electrode 8 and the second clad layer 5.

As a material of which the electrode 8 and the transparent electrode 6 is made includes: Au, Pt, Pd, Ni, or an alloy containing these metals. These metals and alloys are formed on the second clad layer 5 by vacuum evaporation.

The electrode 7 that is connected to the n-type first clad layer 3 is made of Al, Ti, or an alloy containing these metals.

A method of preparing the light-emitting diode 10 according to the first embodiment and specifications of the respective layers will be described next.

The respective semiconductor layers of the light-emitting diode are formed by means of the MOVPE method. In this growth method, a desired crystal is grown on a substrate by supplying ammonia and alkyl compound gases containing group III elements such as trimethylgallium (TMG), trimethylaluminum (TMA), and trimethylindium (TMI) to a substrate that has been heated to an appropriate temperature and by subjecting the gases to a thermal decomposition process.

A single-crystal sapphire substrate 1, having a surface cleaned by an organic cleaning process and a thermal treatment, is attached as a main surface to the susceptor within a vapor-phase reaction system. Then, the sapphire substrate is subjected to a vapor phase etching process at 1100° C. while introducing $N_2$ into the reaction system at a flow rate of 2 l/min at atmospheric pressure.

Then, the buffer layer 2, made of AlN, is formed on the substrate to a thickness of about 50 nm by decreasing the temperature to 400° C. and by supplying $N_2$ at a flow rate of 20 l/min, $NH_3$ at a flow rate of 10 l/min, and TMA at a flow rate of $1.8 \times 10^{-5}$ mol/min.

Then, the first clad layer 3, made of silicon-doped GaN and having a film thickness of about 2200 nm and an electron density of $2 \times 10^{18}/cm^3$, is formed by keeping the temperature of the sapphire substrate and the buffer layer at 1150° C. and by introducing TMG at a flow rate of $1.12 \times 10^{-4}$ mol/min and $NH_3$ at a flow rate of 10 l/min.

Then, the light-emitting layer 4, made of $In_{0.15}Ga_{0.85}N$ and having a film thickness of about 500 nm, is formed by keeping the temperature at 850° C. and by introducing $N_2$ at a flow rate of 20 l/min, $NH_3$ at a flow rate of 10 l/min, TMG at a flow rate of $1.53 \times 10^{-4}$ mol/min, and TMI at a flow rate of $0.02 \times 10^{-4}$ mol/min.

Then, the second clad layer 5, made of magnesium-doped GaN and having a film thickness of about 1000 nm, is formed by keeping the temperature at 850° C. and by introducing $N_2$ at a flow rate of 20 l/min, $NH_3$ at a flow rate of 10 l/min, TMG at a flow rate of $1.12 \times 10^{-4}$ mol/min, and $CP_2Mg$ at a flow rate of $2 \times 10^{-4}$ mol/min. The concentration of magnesium in the second clad layer 5 is $1 \times 10^{20}/cm^3$. The second clad layer 5 is a high-resistance semi-insulator.

Electron beams are thereafter irradiated uniformly onto the second clad layer 5 using an electron beam irradiation system. The electron beam irradiating conditions are: an acceleration voltage of about 10 kV, a sample current of 1 $\mu A$, a beam moving velocity of 0.2 mm/sec, a beam diameter of 60 $\mu m$, and a vacuum degree of $5.0 \times 10^{-5}$ Torr. The second clad layer 5 is transformed into a desired p-type layer while subjected to an electron beam irradiation process performed under the above conditions. It may be noted that the resistance of the second clad layer 5 ranges from 30 to 70 $\Omega/cm$.

The thus formed semiconductor wafer is subjected to a known etching process to have such semiconductor layer structure as shown in FIG. 2. Successively, the electrode 7 is formed on the first clad layer 3 by vacuum evaporation; the transparent electrode 6 made of gold is deposited on the second clad layer 5; and the electrode 8 made of gold is further arranged on the transparent electrode 6 by vacuum evaporation.

The thus formed semiconductor wafer is cut into unit elements to form desired blue light-emitting diodes.

When a forward current of 3.5 V and 20 mA is applied, a blue light-emitting diode emits blue light as visually observed. When this blue light is subjected to a spectroscopic analysis, the peak wavelength thereof is 470 nm.

2nd Embodiment

A light-emitting diode in the second embodiment is a green light-emitting diode having a peak wavelength of 520 nm.

The light-emitting diode according to this embodiment is characterized in that the light-emitting layer comprises $In_{0.21}Ga_{0.79}N$. The light-emitting layer is formed similarly to that of the first embodiment while adjusting the flow rate of TMI.

The specifications of other layers in the second embodiment are the same as those in the first embodiment.

When a forward current of 3.5 V and 20 mA is applied, a green light-emitting diode emits green light as visually observed. When this green light is subjected to a spectroscopic analysis, the peak wavelength thereof is 520 nm.

The invention is not limited to the aforementioned descriptions of the modes of embodiment and specific examples thereof whatsoever, and includes various modifications that can be conceived by the skilled in the art without departing from the scope of the claims.

The invention is, of course, applicable to laser diodes.

As described in the foregoing, a light-emitting layer that is formed on a sapphire substrate and that is made of $In_XGa_{1-X}N$ exhibits the following approximate relationship between the indium mole fraction X and the wavelength λ of an emitted ray of light, this relationship being a new discovery.

$$\lambda\ (nm) = 1239.8/Eg\ (eV)$$

$$Eg = 3.4*(1-X) + 1.95*X - 4.26*X*(1-X)$$

Figure 1:
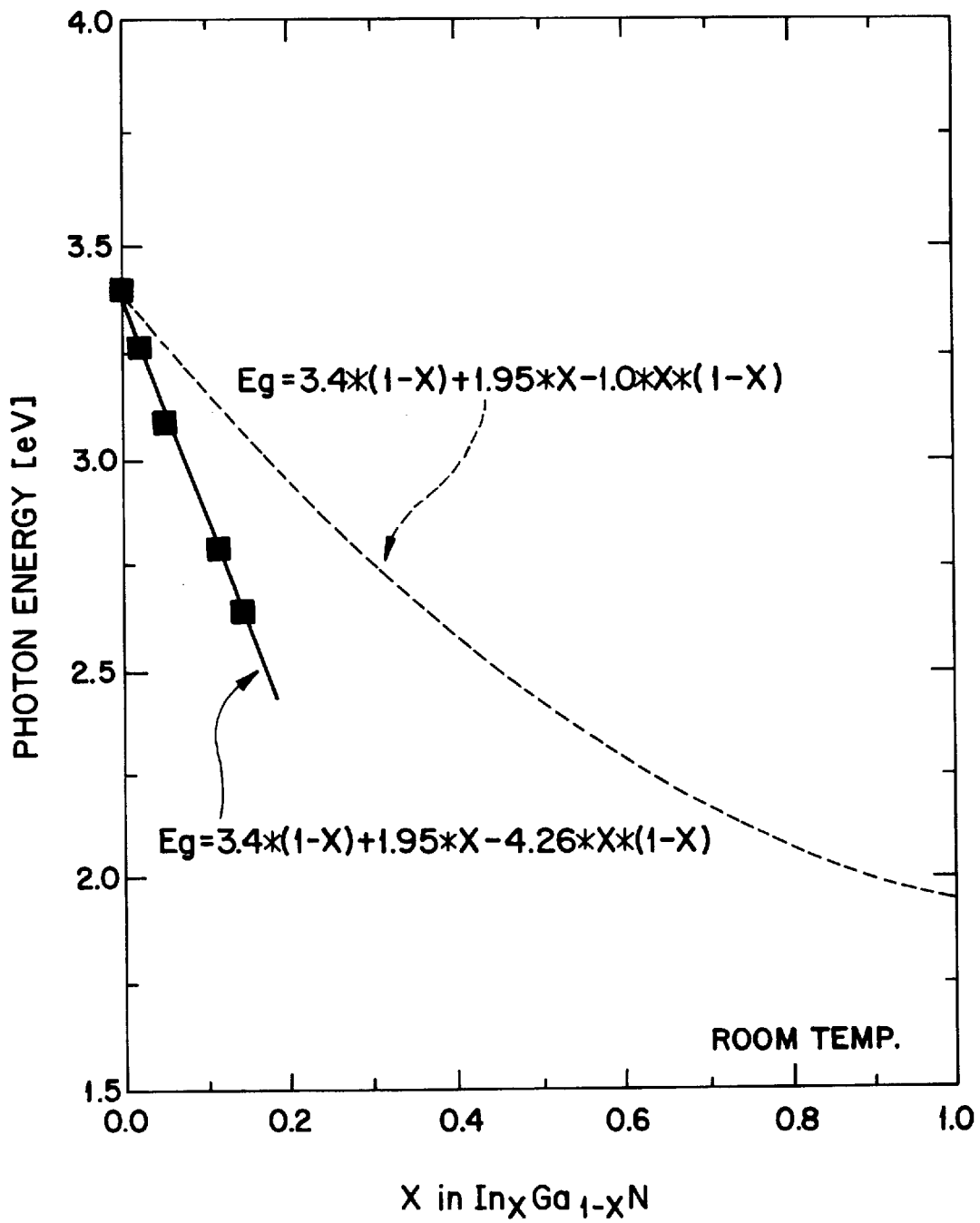
FIG. 1 is a graph showing relationships between the indium mole fraction and photon energy of rays of light emitted from light-emitting layers.

On the other hand, in the conventionally proposed relationship, the coefficient in the third term was −1.0 as shown in FIG. 1.

Therefore, according to the invention, the indium mole fraction X is smaller than in the convention example when a ray of light having the same wavelength is to be emitted. For example, to emit rays of light whose wavelengths are 470 nm and 520 nm, indium mole fractions of 0.26 and 0.67 were required in the conventional example, while indium mole fractions of 0.15 and 0.21 are required according to the present invention. It is generally said that a larger indium mole fraction impairs the crystal quality of a light-emitting layer and thus reduces light-emitting efficiency. Hence, according to the invention, a semiconductor light-emitting device having a light-emitting layer whose light-emitting efficiency is high can be provided.

Further, the following method for controlling a wavelength of a semiconductor light-emitting device can be obtained based on the aforementioned facts. That is, in a semiconductor light-emitting device having a sapphire substrate with a light-emitting layer being formed of $In_XGa_{1-X}N$ and emitting light whose wavelength is $\lambda$, the wavelength $\lambda$ is controlled while changing the indium mole fraction X so as to satisfy the following relationship:

$$\lambda\ (nm)=1239.8/Eg\ (eV)$$

$$Eg=3.4*(1-X)+1.95*X-4.26*X*(1-X).$$

What is claimed is:

1. A light-emitting device comprising:
   a sapphire substrate; and
   a light-emitting layer comprising $In_XGa_{1-X}N$ with an indium mole fraction X and emitting light with a wavelength $\lambda$, wherein
   the indium mole fraction X and the wavelength $\lambda$ approximately satisfy the following conditions:

$$\lambda\ (nm)=1239.8/Eg\ (eV)$$

$$Eg=3.4*(1-X)+1.95*X-4.26*X*(1-X),\ \text{and}$$

said light-emitting layer has the indium mole fraction X ranging from about 0.13 to about 0.18 and emits blue light.

2. A light-emitting device according to claim 1, further comprising:
   a buffer layer comprising AlN;
   a first clad layer comprising n-GaN; and
   a second clad layer comprising p-GaN doped with magnesium.

3. A light-emitting device according to claim 2, further comprising:
   a transparent electrode comprising gold disposed on said second clad layer; and
   an electrode pad disposed on said first clad layer.

4. A light-emitting device according to claim 2, further comprising:
   an interposed layer comprising $Al_XIn_YGa_{1-X-Y}N$, wherein said interposed layer has a wide band gap, is doped with an acceptor, and is interposed between said light-emitting layer and said second clad layer.

5. A light-emitting device according to claim 4, wherein said acceptor is a group IIA element.

6. A light-emitting device according to claim 4, wherein said acceptor is magnesium.

7. A light-emitting device comprising:
   a sapphire substrate; and
   a light-emitting layer comprising $In_XGa_{1-X}N$ with an indium mole fraction X and emitting light with a wavelength $\lambda$, wherein
   the indium mole fraction X and the wavelength $\lambda$ approximately satisfy the following conditions:

$$\lambda\ (nm)=1239.8/Eg\ (eV)$$

$$Eg=3.4*(1-X)+1.95*X-4.26*X*(1-X),\ \text{and}$$

said light-emitting layer has the indium mole fraction X ranging from about 0.19 to about 0.26 and emits green light.

8. A light-emitting device according to claim 7, further comprising:
   a buffer layer comprising AlN;
   a first clad layer comprising n-GaN; and
   a second clad layer comprising p-GaN doped with magnesium.

9. A light-emitting device according to claim 8, further comprising:
   a transparent electrode comprising gold disposed on said second clad layer; and
   an electrode pad disposed on said first clad layer.

10. A light-emitting device according to claim 8, further comprising:
    an interposed layer comprising $Al_XIn_YGa_{1-X-Y}N$, wherein said interposed layer has a wide band gap, is doped with an acceptor, and is interposed between said light-emitting layer and said second clad layer.

11. A light-emitting device according to claim 10, wherein said acceptor is a group IIA element.

12. A light-emitting device according to claim 10, wherein said acceptor is magnesium.

13. A semiconductor light-emitting device comprising:
    a sapphire substrate; and
    a light-emitting layer comprising $In_XGa_{1-X}N$ with an indium mole fraction X and emitting light with a wavelength $\lambda$;
    wherein the indium mole fraction X and the wavelength $\lambda$ of the emitted light approximately satisfy the following conditions:

$$\lambda\ (nm)=1239.8/Eg\ (eV)$$

$$Eg=3.4*(1-X)+1.95*X-4.26*X*(1-X).$$

14. A semiconductor light-emitting device according to claim 13, wherein the indium mole fraction X ranges from about 0.13 to about 0.18, and the light-emitting layer emits blue light.

15. A semiconductor light-emitting device according to claim 13, wherein the indium mole fraction X ranges from about 0.19 to about 0.26, and the light-emitting layer emits green light.

16. A semiconductor light-emitting device according to claim 13, further comprising:
    a buffer layer comprising AlN;
    a first clad layer comprising n-GaN; and
    a second clad layer comprising p-GaN doped with magnesium.

17. A semiconductor light-emitting device according to claim 16, further comprising:

a transparent electrode comprising gold disposed on said second clad layer; and an electrode pad disposed on said first clad layer.

18. A semiconductor light-emitting device according to claim 16, further comprising:

an interposed layer comprising $Al_X In_Y Ga_{1-X-Y} N$, wherein said interposed layer has a wide band gap, is doped with an acceptor, and is interposed between said light-emitting layer and said second clad layer.

19. A light-emitting device according to claim 18, wherein said acceptor is a group IIA element.

20. A light-emitting device according to claim 18, wherein said acceptor is magnesium.

21. A light-emitting device comprising:

a sapphire substrate; and a light-emitting layer comprising $In_X Ga_{1-X} N$ with an indium mole fraction X and emitting light, wherein an energy level $E_g$ of the emitted light is lower than an energy level calculated according to the following condition:

$$Eg=3.4*(1-X)+1.95*X-1.0*X*(1-X).$$

22. A semiconductor light-emitting device according to claim 21, wherein the indium mole fraction X ranges from about 0.13 to about 0.18, land the light-emitting layer emits blue light.

23. A semiconductor light-emitting device according to claim 21, wherein the indium mole fraction X ranges from about 0.19 to about 0.26, and the light-emitting layer emits green light.

24. A semiconductor light-emitting device according to claim 21, further comprising:

a buffer layer comprising AlN;

a first clad layer comprising n-GaN; and a second clad layer comprising p-GaN doped with magnesium.

25. A semiconductor light-emitting device according to claim 24, further comprising:

a transparent electrode comprising gold disposed on said second clad layer; and an electrode pad disposed on said first clad layer.

26. A semiconductor light-emitting device according to claim 24, further comprising:

an interposed layer comprising $Al_X In_Y Ga_{1-X-Y}$, wherein said interposed layer has a wide band gap, is doped with an acceptor, and is interposed between said light-emitting layer and said second clad layer.

27. A light-emitting device according to claim 26, wherein said acceptor is an alkalai-earth metal.

28. A light-emitting device according to claim 26, wherein said acceptor is magnesium.

* * * * *

UNITED STATES PATENT AND TRADEMARK OFFICE
CERTIFICATE OF CORRECTION

PATENT NO.     : 6,188,087 B1
DATED          : February 13, 2001
INVENTOR(S)    : Norikatsu Koide, Masayoshi Koike, Shiro Yamasaki, Isamu Akasaki and Hiroshi Amano It is certified that error appears in the above-identified patent and that said Letters Patent is hereby corrected as shown below:

<u>Column 7,</u>
Line 20, delete "$E_g$"; and
Line 21, after "level" insert -- $E_g$ --.

Signed and Sealed this

Fifteenth Day of October, 2002

*Attest:*

*Attesting Officer*

JAMES E. ROGAN
*Director of the United States Patent and Trademark Office*